United States Patent [19]
Someya et al.

[11] Patent Number: 5,252,932
[45] Date of Patent: Oct. 12, 1993

[54] WAVEFORM EQUALIZING FILTER UNIT

[75] Inventors: Ikuo Someya, Tokyo; Masahiro Komoda, Kanagawa, both of Japan

[73] Assignee: Sony Corporation, Tokyo, Japan

[21] Appl. No.: 725,448

[22] Filed: Jul. 3, 1991

[30] Foreign Application Priority Data

Jul. 9, 1990 [JP] Japan .................. 2-179696

[51] Int. Cl.⁵ .................... H03H 15/00; H04B 3/14
[52] U.S. Cl. ........................ 333/18; 333/166; 375/12; 364/724.16; 364/724.2
[58] Field of Search ............ 333/166, 18; 375/11, 375/12, 14; 364/724.16, 724.2

[56] References Cited

U.S. PATENT DOCUMENTS

| | | |
|---|---|---|
| 3,715,666 | 2/1973 | Mueller et al. .................. 333/18 X |
| 4,403,245 | 9/1983 | Wischermann ................. 333/166 X |
| 4,524,424 | 6/1985 | White ............................. 333/166 X |
| 4,607,377 | 8/1986 | Atobe et al. ..................... 375/14 |
| 4,759,035 | 7/1988 | McGary et al. ................. 333/18 X |
| 5,048,055 | 9/1991 | Creigh et al. .................... 333/18 X |
| 5,050,186 | 9/1991 | Gurcan et al. ................... 333/18 X |

FOREIGN PATENT DOCUMENTS

| | | | |
|---|---|---|---|
| 174005 | 3/1986 | European Pat. Off. ............ | 375/11 |
| 1312 | 1/1987 | Japan ............................... | 364/724.16 |

Primary Examiner—Benny Lee
Attorney, Agent, or Firm—Lewis H. Eslinger; Jay H. Maioli

[57] ABSTRACT

A waveform equalizing filter unit includes a waveform equalizing filter with a plurality of taps each having a unitary delay element and a coefficient multiplier, a clock switching circuit for selecting a clock signal from at least two different frequencies, with the selected clock signal being fed to each of the unitary delay elements of the waveform equalizing filter, and a control circuit for selectively switching the tap coefficients of the coefficient multiplier in the waveform equalizing filter based upon which one of the different clock signals has been selected. A signal time adjuster is further included in a stage situated before the waveform equalizing filter that receives the input signal prior to being fed to the waveform equalizing filter to adjust the timing of the input signal in synchronism with the operation of selecting one of the different clock signal frequencies.

2 Claims, 6 Drawing Sheets

WAVEFORM EQUALIZING FILTER UNIT

BACKGROUND OF THE INVENTION

1. Field of the Invention

The present invention relates to a waveform equalizing filter unit for use in equalizing waveform distortions or the like in a decoder employed in a high definition television (HDTV) system and, more particularly, to a waveform equalizing filter unit capable of selectively switching clock signals in accordance with the distortion characteristic.

2. Description of the Prior Art

It is known that waveform equalizing filters are employed in a variety of signal processing fields inclusive of a communication system. Out of such waveform equalizing filters, the one most commonly used is a type termed a transversal filter.

First a description will be given with regard to an exemplary case of applying such waveform equalizing filter to a MUSE (Multiple Sub-Nyquist Sampling Encoding) decoder in a receiver of the HDTV system. The MUSE format is based on a sample value transmission method which rearranges samples of an input video signal and transmits the same in the form of analog sample values. (Refer to Nikkei Electronics, No. 433, Nov. 2, 1987, p. 192) Transmission distortion causes interference between sample values and induces ringing on a reproduced image. Effective removal of such ringing is achieved by the provision of a waveform equalizing filter in a MUSE decoder to perform equalization of the waveform. An exemplary circuit configuration of a MUSE decoder is shown in FIG. 6. (Refer to Iwadate et al., "Built-in Type Waveform Equalizer for MUSE Decoder", 1988 National Convention of Television Society, 16-6, pp. 351-352)

The MUSE decoder of FIG. 6 comprises a low-pass filter 11, a clamping circuit 12, a main-line signal A-D (analog-to-digital) converter 13, a delay circuit 14, an FET (Field effect transistor) amplifier 16, a sub-line signal A-D converter 17, a waveform equalizing filter 18, a switch 19, an adder 15, a VIT (vertical interval test) signal extractor 20 and a microcomputer 21 which are connected as shown. Since the MUSE transmission rate is 16.2 MHz, sampling by the main-line A-D converter 13 is executed at a frequency (rate) of 16.2 MHz. Meanwhile, waveform equalization needs to be performed at a sampling frequency of, in principle, at least 32.4 MHz which is double the MUSE transmission rate. Therefore the sampling frequency of the sub-line A-D converter 17 is set to 32.4 MHz. Consequently the sampling frequency of the waveform equalizing filter 18 is set also to 32.4 MHz.

The switch 19 serves to apply an output signal of the waveform equalizing filter 18 at a VIT timing to a main-line signal, and in accordance with the VIT signal extracted by the VIT signal extractor 20, the microcomputer (MC) 21 determines a tap coefficient of the waveform equalizing filter in response to a reference impulse multiplexed in the vertical blanking period of the MUSE signal, thereby setting the tap coefficient in a coefficient multiplier of the waveform equalizing filter so as to cancel the transmission distortion.

The distortion to be equalized varies widely depending on the signal transmission line and the signal distribution line. For example, in satellite broadcasting where distortion is small, the sampling frequency of the sub-line A-D converter and that of the waveform equalizing filter are both 32.4 MHz to realize fine waveform equalization. Meanwhile, in case a CATV network is utilized, great deterioration is caused in a reproduced image due to reflection in the distribution line or distortion in the transmission line, hence necessitating waveform equalization in a temporally long range. In such a case, a sampling frequency of 16.2 MHz may be sufficient. (Refer to Ito et al., "Waveform Equalizer for MUSE Signal Transmission", Technical Report in Television Society, Oct. 26, 1989, pp. 13-17)

Thus, the waveform equalizing filter in the MUSE decoder needs to have an adequate equalization characteristic which conforms with the distortion characteristic. Consequently it is necessary to incorporate a plurality of waveform equalizing filters in the MUSE decoder and to use them selectively. However, since each waveform equalizing filter is composed of an expensive transversal filter with multiple taps to perform a fast operation, it is difficult to provide a plurality of such filters. Considering in particular that a MUSE decoder is incorporated in a television receiver of a general user, the provision of such filter brings about a rise in the cost of each television receiver. It is therefore not practical to employ a plurality of waveform equalizing filters in each television receiver.

The problem mentioned above is not limited to a MUSE decoder alone, but also arises in regard to any other communication system.

OBJECT AND SUMMARY OF THE INVENTION

It is an object of the present invention to provide an improved waveform equalizing filter unit of a simplified circuit configuration which includes merely a single filter capable of equalizing different distortions.

According to one aspect of the present invention, there is provided a waveform equalizing filter unit which comprises a waveform equalizing filter with a plurality of taps each having a unitary delay element and a coefficient multiplier, a clock switching circuit for selecting one of clock signals of at least two different frequencies inputted thereto and outputting the selected clock signal to the unitary delay elements of the waveform equalizing filter, and a control means for switching the tap coefficients of the coefficient multipliers in the waveform equalizing filter in cooperation with the selective switching control of the clock switching circuit.

Preferably, the control means in such filter unit calculates the equalization characteristics of the filter unit relative to the clock signals of mutually different frequencies, then compares the calculated characteristics with each other, and enables the clock switching circuit to output therefrom the selected clock signal suited to provide the best equalization characteristic, while setting the optimal tap coefficients at that instant in the coefficient multipliers of the filter.

More preferably, the waveform equalizing filter unit of the present invention includes, in a stage situated before the waveform equalizing filter, a signal timing adjuster for adjusting the signal timing in accordance with selective switching of the clock signal.

And further preferably, the clock switching circuit in the waveform equalizing filter unit is so formed as to be capable of switching the clock signal for the individual unitary delay elements of the filter.

In the waveform equalizing filter unit of the present invention, clock signals for the unitary delay elements are switched in the single waveform equalizing filter while the number of taps of such filter remains unchanged, and tap coefficients of the coefficient multipliers in the filter are set in accordance with selective switching of the clock signals. Due to such circuit configuration, it becomes possible to equalize the waveforms of different distorted signals merely by a single waveform equalizing filter. And in case a lower clock frequency is selected, the entire tap range is rendered longer to substantially widen the equalizable range, hence enabling enhanced removal of wider-range ringing.

Preferably the selective setting of tap coefficients by the control means is executed in accordance with the distortion to be equalized. More specifically, the control means first calculates the equalization characteristics relative to mutually different clock signals, then selects one clock signal suited to provide the best equalization characteristic and, after further calculating the tap coefficients relative to the selected clock signal, sets the calculated coefficients in the coefficient multipliers of the waveform equalizing filter.

The signal transmission timing to be synchronized with switching of the clock signal can be adjusted by the additional provision of a signal timing adjuster.

Furthermore, the clock switching operation can be performed for the individual unitary delay elements in the waveform equalizing filter.

The above and other features and advantages of the present invention will become apparent from the following description which will be given with reference to the illustrative accompanying drawings.

DESCRIPTION OF THE PREFERRED EMBODIMENTS

Figure 6:
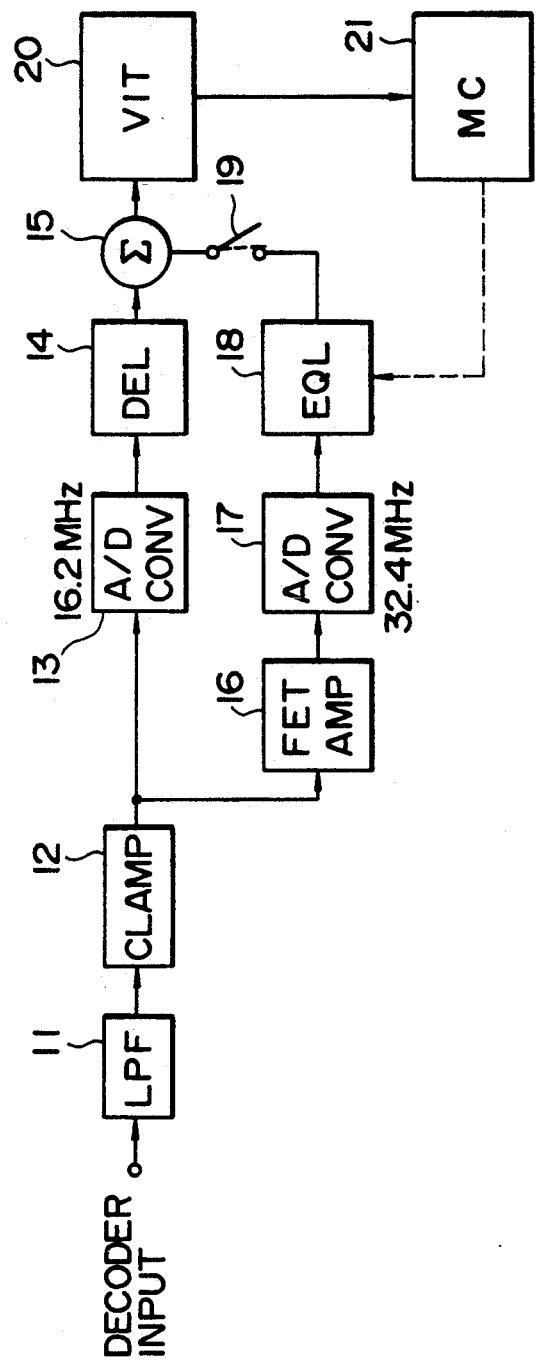
FIG. 6 is a block diagram of an exemplary MUSE decoder to which the waveform equalizing filter unit of the present invention is applied.

A description will first be given with regard to an exemplary case of applying the waveform equalizing filter unit of the present invention to a waveform equalizer 18 incorporated in a MUSE decoder of FIG. 6.

Figure 1:
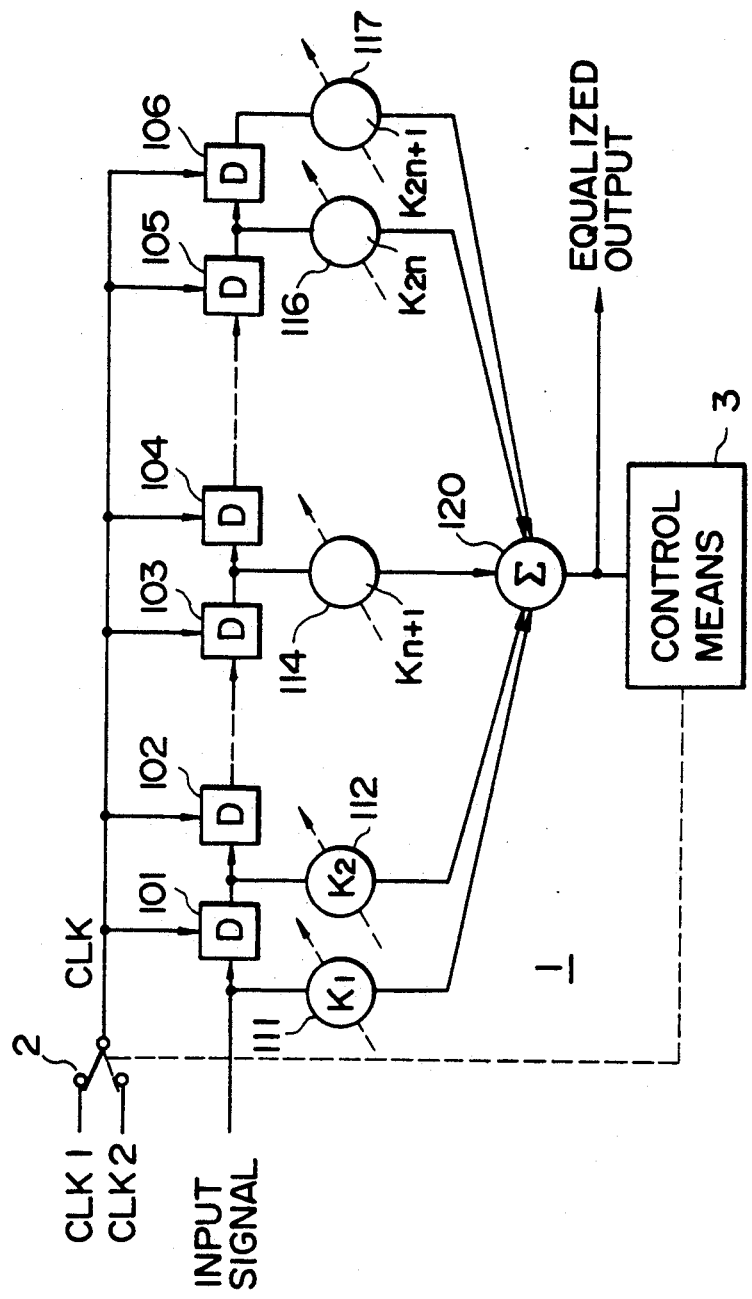
FIG. 1 is a circuit diagram of a first embodiment of the waveform equalizing filter unit according to the present invention.

FIG. 1 is a block diagram of a first embodiment of such waveform equalizing filter unit. This filter unit comprises a transversal type waveform equalizing filter 1, a clock switching circuit 2 and a control means 3 connected to one another as shown. The waveform equalizing filter 1 has a plurality (e.g., 2n=100) of taps each consisting of a unitary delay element 101 and a coefficient multiplier 111, and the results of multiplications executed therein are added by an adder 120. Tap coefficient $k_1, k_2 \ldots k_{n+1} \ldots k_{2n}, k_{2n+1}$ of the coefficient multipliers 111-117 are set by the control means 3. Each of the unitary delay elements 101-106 causes a delay of a unitary time corresponding to one clock pulse. Since the fundamental operation of the waveform equalizing filter 1 is generally known, an explanation thereof is omitted here.

The clock switching circuit 2 is supplied with both a first clock signal CLK1 and a second clock signal CLK2. The first clock signal CLK1 has a frequency of 16.2 MHz, and the second clock signal CLK2 has a frequency of 32.4 MHz.

Now the operation of the waveform equalizing filter unit shown in FIG. 1 will be described below with respect to exemplary cases where a television receiver is switched manually to a signal broadcast from a satellite (BS) with small distortion and to a CATV signal with great distortion. In both cases, the clock switching circuit 2 serves as a mode switch in the television receiver.

When a user changes the clock switching circuit 2 from a CATV mode to a BS mode, the clock switching circuit 2 is placed in a state represented by a broken line in FIG. 1. As a result, the clock signal CLK outputted from the clock switching circuit 2 is changed to the second clock signal CLK2 of 32.4 MHz, which is then supplied to the unitary delay elements 101-106. The control means 3 keeps monitoring the state of the clock switching circuit 2 and, upon detection of the change of the clock switching circuit 2, sets coefficients $k_1, k_2 \ldots k_{n+1} \ldots k_{2n}, k_{2n+1}$, which correspond to the second clock signal CLK2, in the coefficient multipliers 111-117. Thus, waveform equalization relative to the CATV input signal supplied to the waveform equalizing filter 1 is performed at a frequency of 32.4 MHz, and the equalized output is delivered from an adder 12. The control means 3 is composed of a microcomputer with a memory to store therein tap coefficients $k_1, k_2 \ldots k_{n+1} \ldots k_{2n}, k_{2n+1}$ corresponding to the first clock signal CLK1 and the tap coefficients $k_1, k_2 \ldots k_{n+1} \ldots k_{2n}, k_{2n+1}$ corresponding to the second clock signal CLK2.

When the clock switching circuit 2 is changed from a BS mode to a CATV mode, the first clock signal CLK1 of 16.2 MHz is supplied from the clock switching circuit 2 to the unitary delay elements 101-106, and tap coefficients $k_1, k_2 \ldots k_{n+1} \ldots k_{2n}, k_{2n+1}$ corresponding to the first clock signal CLK1 ar set in the coefficient multipliers 111-117 by the control means 3.

As described above, due to selective switching of the clock signal CLK and the tap coefficients $k_1, k_2 \ldots k_{n+1} \ldots k_{2n}, k_{2n+1}$ in the waveform equalizing filter 1, it becomes possible to properly perform, by the single filter 1, satisfactory waveform equalization relative to two kinds of input signals. The entire tap range in one case of selecting the first clock signal CLK1 of 16.2 MHz becomes virtually double the range in another case of selecting the second clock signal CLK2 of 32.4 MHz, hence achieving removal of the ringing in double the equalization range as compared with the latter case of the second clock signal CLK2.

The number of the clock signals switchable by the clock switching circuit 2 and the number of the tap coefficients $k_1, k_2 \ldots k_{n+1} \ldots k_{2n}, k_{2n+1}$ settable by the control means 3 are not limited to the above-described two alone, and may be increased to three or more.

Hereinafter a description will be given of a second embodiment which represents another exemplary case of automatically switching the clock signals CLK and the tap coefficients $k_1, k_2 \ldots k_{n+1} \ldots k_{2n}, k_{2n+1}$ by the waveform equalizing unit of FIG. 1 in accordance with the distortion characteristic of the input (received) signal. In this case, the clock switching circuit 2 is so formed as to be selectively driven by the control means 3.

Figure 2:
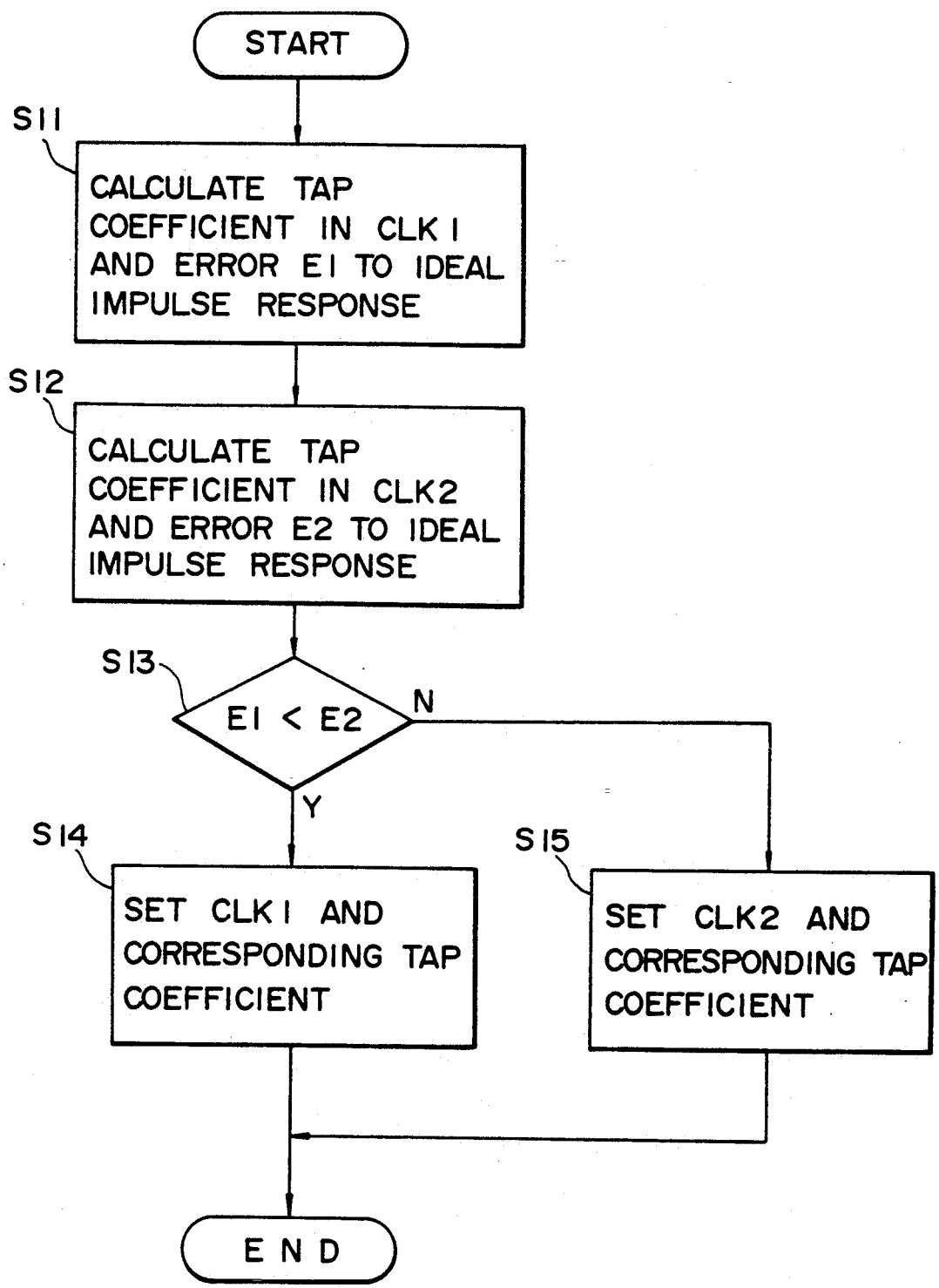
FIG. 2 is a flow chart of a processing routine executed by a switching control means in FIG. 1.

Similarly to the aforementioned, the control means 3 consists of a microcomputer and determines which of the clock signals is more suited for operating the waveform equalizing filter 1 to optimally equalize the distortion of the received signal. The operation of the control means 3 will now be described below with reference to a flow chart of FIG. 2. The operating procedure is executed in synchronism with the VIT timing.

Step 11 (S11)

The control means 3 calculates, with regard to the first clock signal CLK1, a tap coefficient and an error E1 between a VIT pulse and an ideal impulse response. Hereinafter its algorithm will be described with reference also to the principle of equalization. (Refer to Op. cit., 1988 National Convention of Television Society, 16-5)

The received series Y(nT) is expressed by the following equation in relation to the tap coefficient H(nT) (where n is an integer, and T is a time interval of first clock pulses CLK1 (16.2 MHz)), the transmission characteristic F(nT) and the ideal impulse response I(nT).

$$Y(nT) = [I(nT) * F(nT)] + [I(nT) * F(nT) * H(nT)] \quad (1)$$

where * denotes convolution.

$$\text{If } H(nT) = F^{-1}(nT) \cdot \delta(nT) \quad (2)$$

where $F^{-1}(nT)$ is the inverse transmission characteristic of F(nT), $\delta(nt)$ is the delta function of the transmission characteristic such that $F(nT) * F^{-1}(nT) = \delta(nT)$, and $\delta(nT) = 1$ when $n = 1$
$\delta(nT) = 0$ in other condition,
then $$Y(nT) = I(nT) \quad (3)$$

Thus the equalization is completed. Since the amplitude characteristic is not equalized, the equalization is repeated at each VIT timing. Such repetitive correction is executed by using the error between the ideal impulse response and the VIT pulse inputted to the control means 3, thereby correcting the tap coefficient at the relevant instant. The received series relative to the first tap coefficient Hi(nT) is expressed as $$Hi(nT) * I(nT) * F(nT) + I(nT) * F(nT) = I(nT) + Ei(nT) \quad (4)$$

where Ei(nT) is the error.

When the process is so executed repeatedly as to minimize the error Ei(nT), the tap coefficient Hi(nT) at that instant is expressed by the following equation.

$$Hi(nT) = I(-nT) * F(-nT) \quad (5)$$

$$\left[ \delta(nT) \sum_{j=0}^{i-1} Ej + 1\,(nT) \right] \quad (5)$$

where $$\sum_{j=0}^{i-1} Ej + 1\,(nT)$$

is the error of the (j+1) term

In this manner, relative to the first clock signal CLK1, there are calculated the tap coefficients $Hi(nT) = k_1, k_2 \ldots k_{n+1} \ldots k_{2n}, k_{2n+1}$ and the error E1 in the repetitive step i.

Step 12 (S12)

The control means 3 calculates the tap coefficients $k_1, k_2 \ldots k_{n+1} \ldots k_{2n}, k_{2n+1}$ and the error E2 relative to the second clock signal CLK2 similarly to the above.

Steps 13-15 (S13-S15)

The control means 3 compares the two errors E1 and E2 with each other, then selects one clock signal having the smaller error, and energizes the clock switching circuit 2 in a manner to output the selected clock signal therefrom. Further, the control means 3 sets the calculated tap coefficients $k_1, k_2 \ldots k_{n+1} \ldots k_{2n}, k_{2n+1}$ in the coefficient multipliers 111-117 of the waveform equalizing filter 1.

The above process of the control means 3 is executed at every VIT timing so that optimal clock signals for the distortion are selected sequentially while the tap coefficients $k_1, k_2 \ldots k_{n+1} \ldots k_{2n}, k_{2n+1}$ are also optimized to consequently attain satisfactory equalization.

Figure 3:
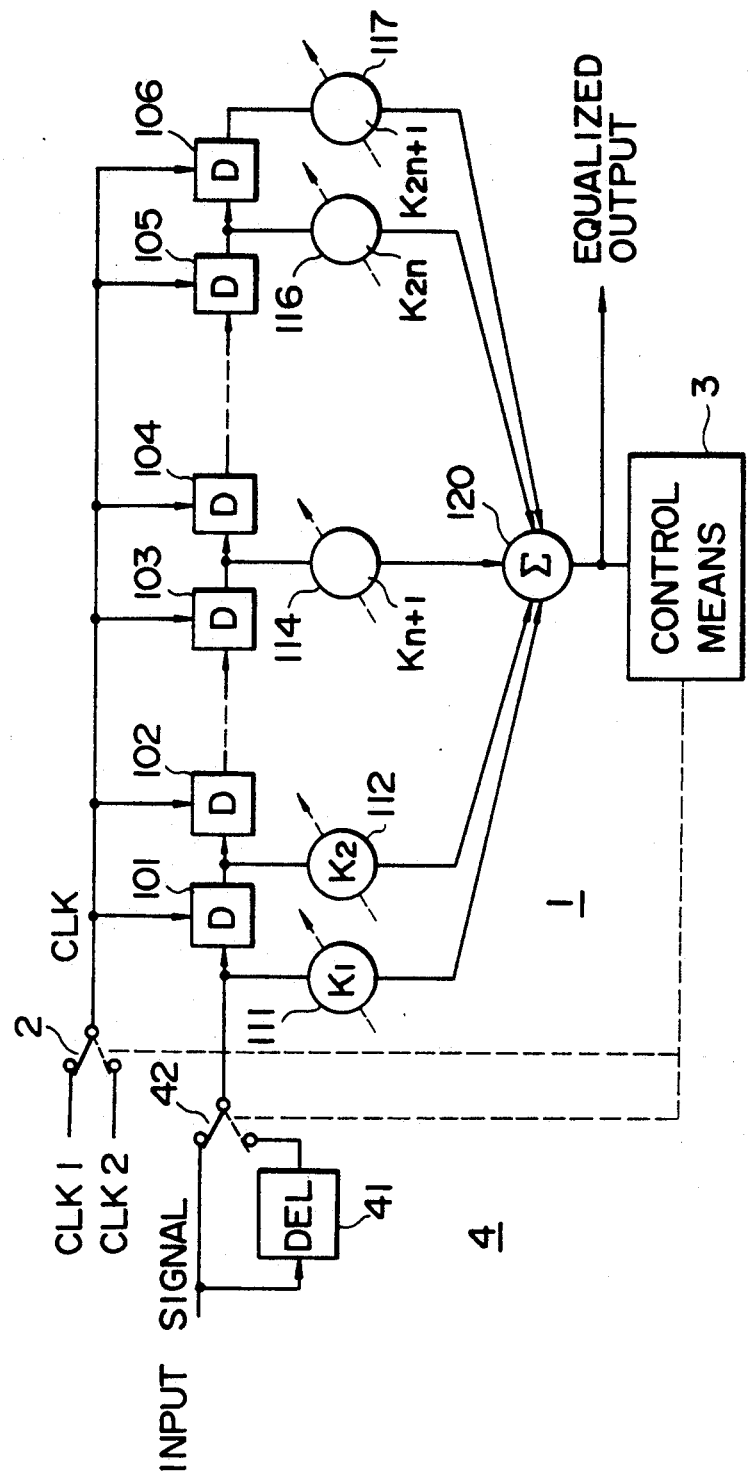
FIGS. 3 through 5 are circuit diagrams of second through fourth embodiments of the waveform equalizing filter unit according to the present invention.

A third embodiment shown in FIG. 3 has a modified circuit configuration so contrived that, in comparison with the aforementioned first and second embodiments, a signal timing adjuster consisting of a delay circuit 41 and a switch 42 is additionally provided to adjust the timing of the input signal supplied to the waveform equalizing filter 1 through switching of the clock signal.

In case the clock switching circuit 2 is changed manually, the switch 42 is also changed manually in combination with the clock switching circuit 2. Meanwhile, when the clock switching circuit 2 is changed by the control means 3, the switch 42 is also changed simultaneously therewith by the control means 3. The delay time of the delay circuit 41 corresponds to the difference between a frequency 16.2 MHz of the first clock signal CLK1 and a frequency 32.4 MHz of the second clock signal CLK2.

Figure 4:
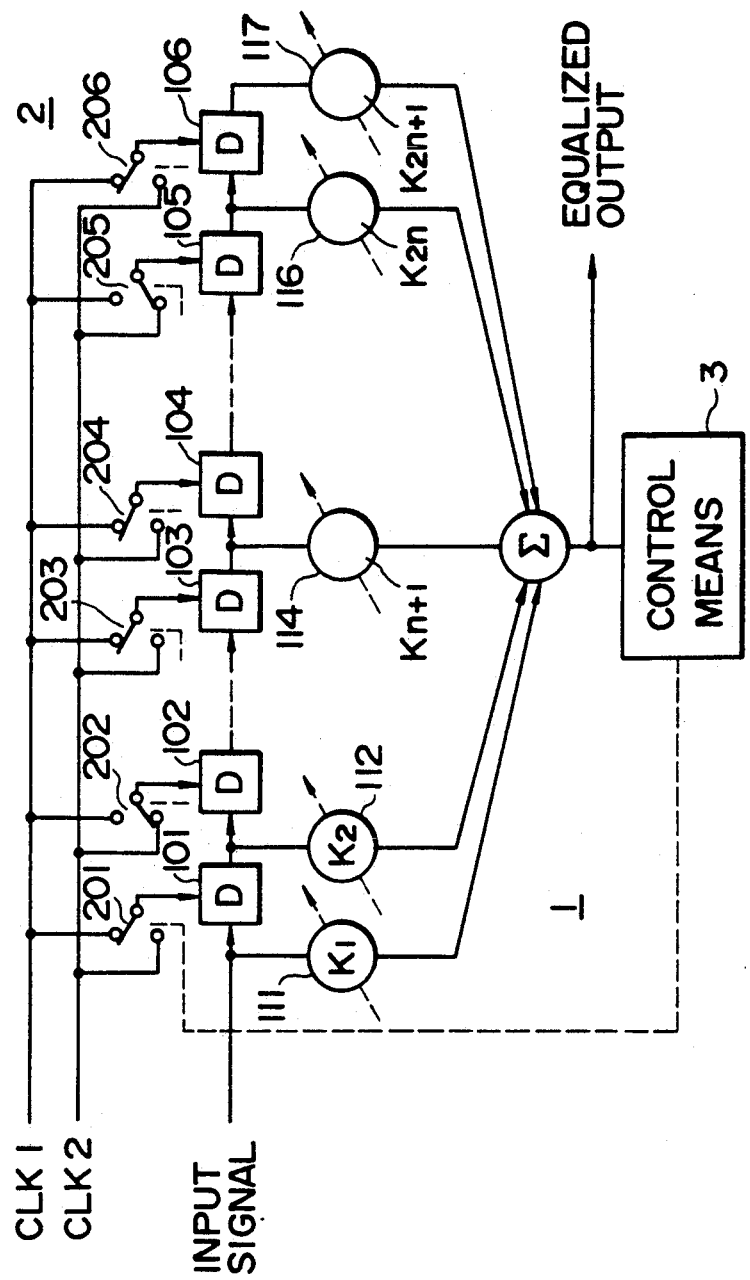

A fourth embodiment shown in FIG. 4 represents an example where clock switching circuits 201-206 are provided correspondingly to unitary delay elements 101-106 in a manner to be selectively changeable for switching the clock signal CLK for the individual unitary delay elements 10. The advantage of this embodiment resides in that, if the equalization range is narrow at a fixed sampling rate of, e.g., 32.4 MHz in the above-described waveform equalizing filter 1 for example and a satisfactory performance is not attainable at another fixed sampling rate of 16.2 MHz, the tap interval can be properly switched to realize optimal equalization with the number of the existing taps remaining unchanged. The operation of switching the clock signals CLK and the operation of switching the coefficients $k_1, k_2 \ldots k_{n+1} \ldots k_{2n}, k_{2n+1}$ correspondingly to the selected clock signal CLK are performed by the control means.

Figure 5:
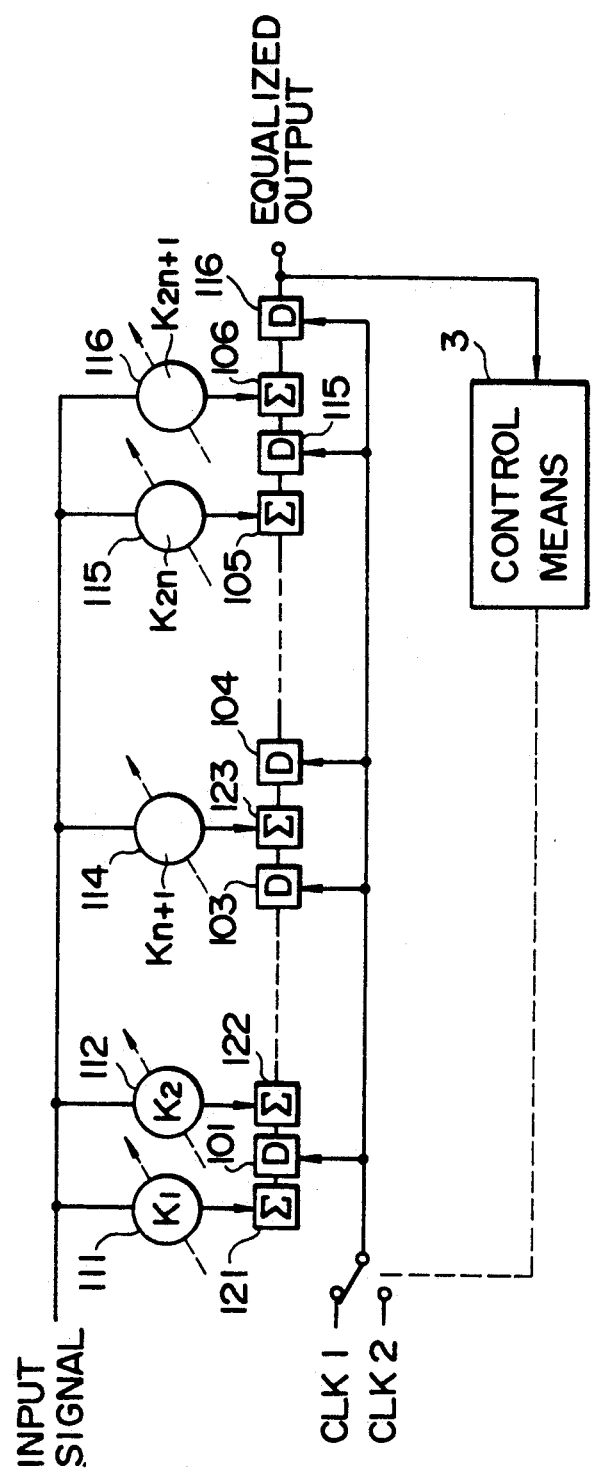

It is to be understood that the waveform equalizing filter in the filter unit of the present invention is not limited to the constitution shown in any of FIGS. 1 through 4, and it may be applied also to a variety of other constitutions such as an inverted transversal filter shown in FIG. 5.

The embodiments mentioned represent merely an exemplary case of employing a waveform equalizing filter unit in a MUSE decoder of an HDTV system.

And the waveform equalizing filter unit of the present invention is applicable to any of various communication systems as well where the equalization characteristic needs to be switched in accordance with the distortion characteristic.

According to the present invention, as described hereinabove, optimal signal waveform equalization conforming to each distortion characteristic can be achieved in a simplified circuit configuration by selectively switching both sampling rates and tap coefficients of a single waveform equalizing filter in accordance with the distortion characteristic.

What is claimed is:

1. A waveform equalizing filter unit for producing an equalized output signal from an input signal to be equalized, comprising:

a waveform equalizing filter realized by a plurality of unitary delay elements connected in series and having a plurality of taps connected respectively to a plurality of coefficient multipliers, the input signal to be equalized is applied to a first one of said plurality of unitary delay elements, each coefficient multiplier having a respective tap coefficient associated therewith, and an adder connected to said plurality of coefficient multipliers for combining outputs thereof to realize the equalized output signal;

a clock switching circuit having two clock signals of different respective frequencies input thereto for selecting one of said clock signals and outputting the selected clock signal to each of the unitary delay elements of said waveform equalizing filter; and control means for determining an error in said equalized output signal relative to a predetermined ideal impulse response characteristic stored in said control means, for controlling said clock switching circuit to select one of said two clock frequencies to minimize said error, and for controlling the respective tap coefficients of said plurality of coefficient multipliers in said waveform equalizing filter upon selection of one of said two clock frequencies by said clock switching circuit and further including, in a stage situated before said waveform equalizing filter, a signal timing adjuster having an input receiving the input signal to be equalized and an output connected to said first one of said plurality of unitary delay elements for adjusting the timing of the input signal to be equalized and being controlled by said control means in synchronism with the operation of said clock switching circuit.

2. A waveform equalizing filter unit for producing an equalized output signal from an input signal to be equalized, comprising:

a waveform equalizing filter realized by a plurality of unitary delay elements connected in series and having a plurality of taps connected respectively to a plurality of coefficient multipliers, the input signal to be equalized is applied to a first one of said plurality of unitary delay elements, each coefficient multiplier having a respective tap coefficient associated therewith, and an adder connected to said plurality of coefficient multipliers for combining outputs thereof to realize the equalized output signal;

a clock switching circuit having two clock signals of different respective frequencies input thereto for selecting one of said clock signals and outputting the selected clock signal to each of the unitary delay elements of said waveform equalizing filter; and control means for determining an error in said equalized output signal relative to a predetermined ideal impulse response characteristic stored in said control means, for controlling said clock switching circuit to select one of said two clock frequencies to minimize said error, and for controlling the respective tap coefficients of said plurality of coefficient multipliers in said waveform equalizing filter upon selection of one of said two clock frequencies by said clock switching circuit and wherein said clock switching circuit comprises a plurality of individual switches, a corresponding individual switch being associated with each of the unitary delay elements of said waveform equalizing filter and said plurality of switches being controlled by said control means so as to connect one of the two clock frequencies to each of the unitary delay elements.

* * * * *